(12) United States Patent
Hatakeyama

(10) Patent No.: US 7,563,408 B2
(45) Date of Patent: Jul. 21, 2009

(54) COPPER ALLOY AND METHOD OF MANUFACTURING THE SAME

(75) Inventor: Kouichi Hatakeyama, Iwata (JP)

(73) Assignee: Dowa Metaltech Co., Ltd., Tokyo (JP)

( * ) Notice: Subject to any disclaimer, the term of this patent is extended or adjusted under 35 U.S.C. 154(b) by 136 days.

(21) Appl. No.: 11/213,986

(22) Filed: Aug. 30, 2005

(65) Prior Publication Data

US 2006/0045790 A1 Mar. 2, 2006

(30) Foreign Application Priority Data

Aug. 30, 2004 (JP) ............................. 2004-250938

(51) Int. Cl.
  *C22C 9/00* (2006.01)
(52) U.S. Cl. ...................... 420/473; 148/553
(58) Field of Classification Search ............. 148/682, 148/553; 428/472; 420/472, 473
  See application file for complete search history.

(56) References Cited

U.S. PATENT DOCUMENTS

| 4,627,960 A * | 12/1986 | Nakajima et al. ........... 420/472 |
| 5,643,679 A * | 7/1997 | Ishimaru et al. ............ 428/472 |
| 2004/0072079 A1* | 4/2004 | Hashimoto et al. .......... 429/245 |

FOREIGN PATENT DOCUMENTS

| JP | 3-87324 | 4/1991 |
| JP | 4-74837 | 3/1992 |
| JP | 2-225638 | 9/1995 |
| JP | 11-286760 | 10/1999 |
| JP | 2000-212660 | 8/2000 |
| JP | 2000-256765 | 9/2000 |
| JP | 2000-328159 | 11/2000 |
| JP | 2001-262296 | 9/2001 |
| JP | 3235149 | 9/2001 |
| JP | 2001-279351 | 10/2001 |
| JP | 2003-96526 | 4/2003 |
| JP | 2003-193211 | 7/2003 |
| JP | 2003-253357 | 9/2003 |
| WO | WO 03/041194 A1 * | 5/2003 |

* cited by examiner

*Primary Examiner*—George Wyszomierski
*Assistant Examiner*—Weiping Zhu
(74) *Attorney, Agent, or Firm*—Clark & Brody

(57) ABSTRACT

A copper alloy of superior flex durability is provided that is suitable for the conducting members of flexible printed circuits. This is a copper alloy where the integrated intensity ratio $I_{\{200\}}/I_{\{111\}}$ found by x-ray diffraction of the rolled surface is 1.5 or less. Examples of its specific chemical composition are: a composition where, in percent by weight, Fe: 0.045-0.095%, P: 0.010-0.030%, the sum of all elements other than Fe, P and Cu is less than 1% and the balance is Cu, and a composition where, in percent by weight, Ni: 0.5-3.0%, Sn: 0.5-2.0%, P: 0.03-0.10%, the sum of all elements other than Ni, Sn, P and Cu is less than 1% and the balance is Cu. The copper alloy has a conductivity of 85% IACS or greater.

10 Claims, 1 Drawing Sheet

[FIG. 1]
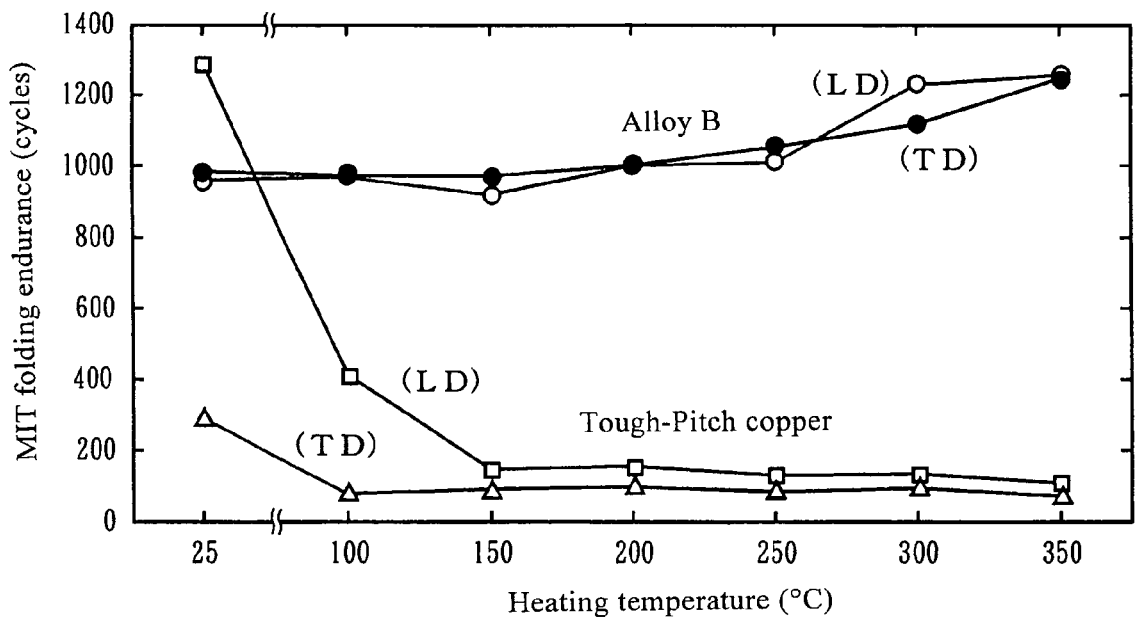
[FIG. 2]
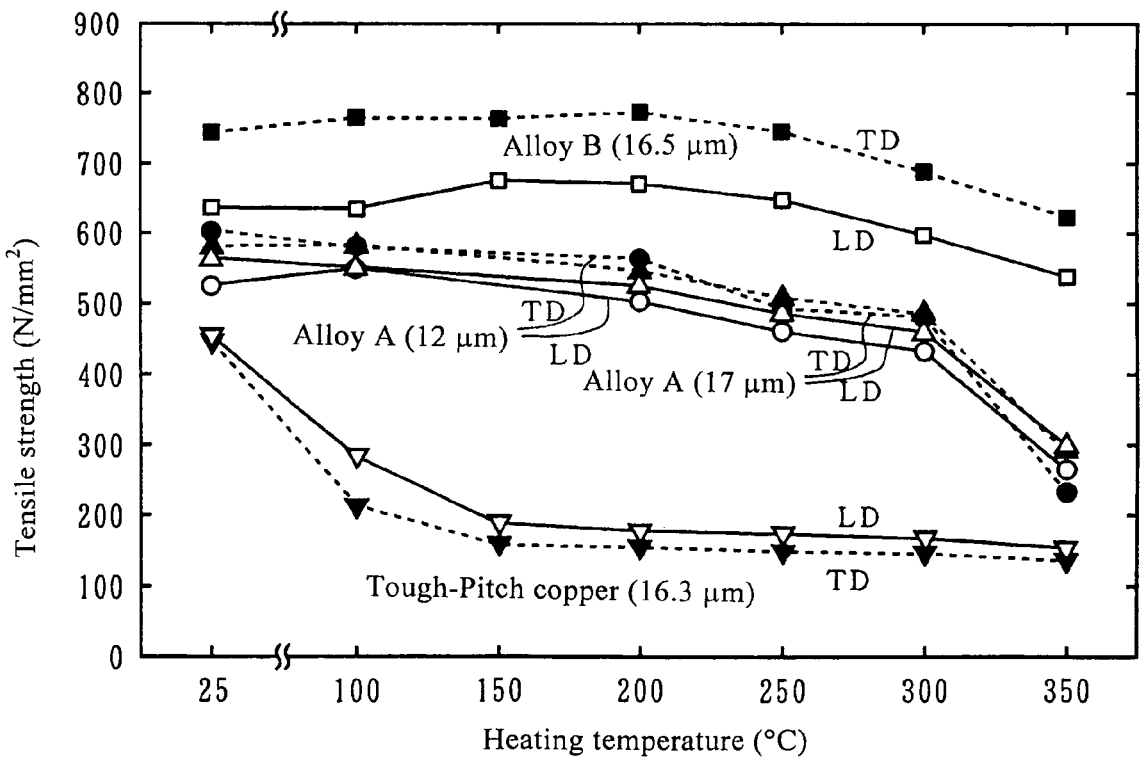

COPPER ALLOY AND METHOD OF MANUFACTURING THE SAME

BACKGROUND OF THE INVENTION

1. Field of the Invention

The present invention relates to a copper alloy with good conductivity that is suitable for foil for the conducting members of flexible printed circuits, and particularly to copper alloy with markedly improved anisotropy and heat resistance with respect to flex durability.

2. Background Art

With the recent popularity of mobile phones, digital cameras and other compact electronic devices, demand for flexible printed circuits (FPC) has increased. Flexible printed circuits are printed circuit boards that are flexible, and being able to bend, they are often used in electronic devices that have very little extra room for mounting electronic components.

In flexible printed circuits, the circuit is typically formed from foil for the conducting members, combined with a polyimide resin or other insulating film, thus giving the circuit board itself flexibility. Examples of the circuit structure include the single-sided type, the double-sided type, the multi-layer type and various other types.

In the past, "copper foil" with low electrical resistance and good extensibility has been used for the conducting members. Specifically, a copper foil formed by rolling Tough-Pitch copper to a thickness of roughly 18-35 μm has entered the mainstream.

Various types of copper foil are recited in Patent Reference Documents 3-7 and 9 below.

On the other hand, various types of copper alloy foil have also been developed. Patent Reference Documents 1 and 2 disclose copper alloy foils for use in flexible printed circuits that contain 1% or more Zn in order to prevent the occurrence of whiskers at the time of Sn plating. Patent Reference Document 10 discloses a copper alloy foil for use in film carriers that contains Fe, P and Pb to improve the resistance to solder thermal delamination. Patent Reference Documents 11 and 12 recite copper alloy foils with Ag and Sn added for improved strength and heat resistance, and with a defined {200} plane x-ray diffraction integrated intensity for improved etching properties. In addition, Patent Reference Document 8 recites a copper alloy foil for use as the negative pole-side collector electrode material for a secondary battery, as one that selectively contains Co, Ni, Fe as well as P. Patent Reference Document 13 recites a copper alloy foil used as the electrode of a Li ion secondary battery, as one that selectively contains Fe and Ag, and contains P.

Patent Reference Document 1: JP 2-225638 A
Patent Reference Document 2: JP 3-87324 A
Patent Reference Document 3: JP 4-74837 A
Patent Reference Document 4: JP 11-286760 A
Patent Reference Document 5: JP 2000-212660 A
Patent Reference Document 6: JP 2000-256765 A
Patent Reference Document 7: JP 2001-262296 A
Patent Reference Document 8: JP 2001-279351 A
Patent Reference Document 9: JP 2003-193211 A
Patent Reference Document 10: JP 3235149 B
Patent Reference Document 11: JP 2003-96526 A
Patent Reference Document 12: JP 2003-253357 A
Patent Reference Document 13: JP 2000-328159 A

SUMMARY OF THE INVENTION

Many electronic devices that have promise for future growth such as mobile phones, digital cameras, laptop computers and the like have folding functions for their liquid-crystal displays or other display components, so their circuits often comprise flexible printed circuits interposed within moving parts. In particular, trends to make devices more compact and stylish have been strong, so limitations on the space for mounting electronic components are becoming more and more severe. For this reason, designers depend more and more on flexible printed circuits, and there is a greater need to dispose flexible printed circuits comprising circuits that have important functions even in moving parts where the actions of folding and extending are repeated in daily use.

In this situation, severe demands are made on flexible printed circuits for improved durability when subjected to repeated folding and extension actions. In order to satisfy these demands, it is important for the conducting members (metal foil) themselves comprising the flexible printed circuit to be given superior durability with respect to bending (flex durability). Moreover, when considering how to increase the degree of freedom of design, it is important for the conducting material to have little directionality with respect to flex durability within the plane of the circuit, or namely it should have little "anisotropy." In the case of the "copper foil" widely used in the past, there is a large difference in flex durability between the longitudinal direction (LD) and the transverse direction (TD) with respect to the direction of rolling. In other words, it has large anisotropy. None of the aforementioned Patent Reference Documents disclose examples of copper alloy foils with improved flex durability without anisotropy.

In addition, a method of manufacturing flexible printed circuits suited to volume production that has been adopted is the cast method wherein the surface of a strip of metal foil continuously unwound from a metal foil coil is coated with an adhesive resin, if necessary, and then coated with a resin (e.g., a polyimide resin) that becomes the base film, which is dried in an oven and hardened. In order to increase the precision of etching at the time of forming the circuits, it is preferable for the conducting material in the flexible circuits to use extremely thin film with a thickness of 8-16 μm, for example. However, at the time that the copper foil is coated with the liquid resin (e.g., 100-200° C.) to become the base film on a continuous line in the aforementioned cast method, the copper foil is softened by this heat, so in consideration of this, it is impossible to pass extremely thin, 8-16 μm-thick copper foil through the continuous line. To solve this problem, typically the half-etching method is adopted wherein a thicker copper film is used and integrated with the base film, and then the copper foil portion is etched to adjust it to the desired thickness. In this case, there are problems in that there is an excessive burden of processing that may lead to decreased material yields. Accordingly, it is preferable to use an extremely thin foil that is not softened by the heat at the time that the resin is applied.

Moreover, one may envision that electronic components may undergo temperature increases in use or may be placed in automobiles. They are thus required to have heat resistance, not simply so that the foil does not soften, but also such that its flex durability does not deteriorate under increased temperature. The copper and copper alloys according to the aforementioned Patent Reference Documents do not consider heat resistance with respect to flex durability.

The present invention was accomplished in consideration of this situation and has as an object to provide a copper alloy that has superior conductivity and resistance to softening, and particularly one that has improved anisotropy and heat resistance with respect to flex durability in the foil state.

As a result of conducting various studies, the present inventor discovered that in a copper alloy finished to a high cold-rolling percent reduction, when a texture having a specific crystal orientation is achieved, the anisotropy of the flex durability is markedly improved and heat resistance with respect to flex durability can also be given.

Specifically, the copper alloy material of superior flex durability provided according to the present invention has an integrated intensity ratio $I_{\{200\}}/I_{\{111\}}$ of 1.5 or less found from the x-ray diffraction pattern measured on the rolled surfaces. In particular, it preferably has a conductivity of 85.0% IACS or greater. In addition, as an alloy with superior softening properties, the invention provides a copper alloy that, after being subjected to a heating test for one hour at 300° C. in a nitrogen atmosphere, has a tensile strength of 300 N/mm$^2$ or greater in both the longitudinal direction (LD) and the transverse direction (TD) with respect to the direction of rolling.

Here, $I_{\{200\}}$ and $I_{\{111\}}$ are the integrated intensities in the {200} plane and {111} plane, respectively. Mo—K$\alpha$ rays are used as the x-ray source.

The present invention provides a "foil" that is particularly suitable for a flexible printed circuit, so its thickness may be 16 μm or less, for example.

An example of the texture of the aforementioned copper alloy is a deformation texture wherein precipitates comprising mainly compounds of metal elements and P (metal element-P-based precipitates) are present in a Cu matrix. Examples of typical metal element-P-based precipitates include Fe—P-based precipitates and Ni—P-based precipitates. The presence of these precipitates may be confirmed by using a transmission electron microscope (TEM), for example.

A "deformation texture" is defined to be the texture of an alloy after undergoing cold working but wherein recrystallization is not observed on the optical microscopic level.

To present examples of alloy compositions, in percent by weight, wherein such a texture is achieved, one example of such a composition is where Fe: 0.045-0.095%, P: 0.010-0.030%, the sum of all elements other than Fe, P and Cu is less than 1% and the balance is Cu (a Cu—Fe—P-based alloy). Another example is where Ni: 0.5-3.0%, Sn: 0.5-2.0%, P: 0.03-0.10%, the sum of all elements other than Ni, Sn, P and Cu is less than 1% and the balance is Cu (a Cu—Ni—Sn—P-based alloy).

Here, the first-mentioned "sum of all elements other than Fe, P and Cu is less than 1%" includes the case in which the elements other than Fe, P and Cu comprise unavoidable impurities. The later "sum of all elements other than Ni, Sn, P and Cu is less than 1%" is similarly defined.

Within the aforementioned copper alloys, the present invention provides one wherein the MIT folding endurance in the LD and TD is 800 cycles or greater, or moreover 1500 cycles or greater.

Evaluation of Flex Durability

Flex durability will be evaluated by performing the MIT folding endurance test based on ASTM D-2176 at room temperature. This test can be performed using MIT folding endurance testers manufactured and sold by any of several instrumentation manufacturers. The testing conditions adopted are as follows: bending angle: ±135°, load: 500 g, bending radius: 0.8 mm. The test pieces used are 25 mm-wide tapes. In order to evaluate anisotropy, it is sufficient to obtain test pieces that are lengthwise in the longitudinal direction (LD) and test pieces that are lengthwise in the transverse direction (TD) with respect to the direction of rolling, and measure the MIT folding endurance (number of bending cycles until failure) for each.

As a method of manufacturing the aforementioned copper alloy, the present invention provides a manufacturing method comprising the steps of preparing recrystallized annealed material with a thickness of 250 μm or less, cold-rolling this material to a rolling percent reduction of 85% or greater, or if necessary, performing an additional finishing heat-treatment at a temperature of no more than 350° C.

With the present invention, a foil of copper alloy that has high flex durability, little anisotropy in its flex durability, and whose flex durability does not deteriorate even at elevated temperatures is achieved. In addition, this copper-alloy foil has sufficient conductivity for use as the conducting members of electronic circuits. Thus, the copper alloy according to the present invention exhibits superior durability when used for conducting members of flexible printed circuits interposed within moving parts, and is also suitable for use in flexible printed circuits not only within moving parts, but also when used while pressed into complex shapes in a narrow mounting space. In addition, the alloy has superior resistance to softening when coated with resin, so an extremely thin film rolled to the desired thickness can be processed directly on a continuous line and integrated with the base film. Accordingly, the present invention contributes to making electronic equipment more compact, improving the degree of freedom of its design, improving its reliability and improving the ease of manufacture of flexible printed circuits.

BRIEF EXPLANATION OF THE DRAWINGS

FIG. 1 is a graph illustrating the effect of the heating temperature after finish cold rolling on the MIT folding duration based on ASTM D-2176 for both a copper-alloy foil of Alloy B (with a thickness of 16.5 μm), which is an embodiment of the present invention, and the conventional material of Tough-Pitch copper foil (with a thickness of 16.3 μm).

FIG. 2 is a graph illustrating the softening characteristics after finish cold rolling for copper-alloy foils of Alloy A and Alloy B, which are embodiments of the present invention, and the conventional material of Tough-Pitch copper foil.

DESCRIPTION OF THE PREFERRED EMBODIMENT

As pointed out above, various copper-alloy films have been proposed in the past for use in flexible printed circuits. However, no techniques for giving superior flex durability with little anisotropy had yet been established. As a result of conducting detailed studies, the present inventor found that by cold-rolling copper alloy, when a texture wherein the integrated intensity ratio $I_{\{200\}}/I_{\{111\}}$ is 1.5 or less is obtained, the flex durability is markedly improved, or namely, a superior flex durability with little anisotropy is achieved. It is even more preferable for the aforementioned integrated intensity ratio to be 1 or less.

Copper alloy wherein the integrated intensity ratio $I_{\{200\}}/I_{\{111\}}$ is 1.5 or less is obtained when "finish cold rolling" is performed at a high rolling percent reduction. The finish cold rolling referred to here is the final cold rolling performed in the process of producing the copper alloy product after heat treatment that heats the material to above the recrystallization temperature. The rolling percent reduction required is not necessarily constant, as it may depend on the alloy composition, the original sheet thickness prior to the finish cold rolling, as well as the degree of recrystallization prior to the finish cold rolling, but a percent reduction of at least 85% or greater is necessary.

With Tough-Pitch copper, a texture with an integrated intensity ratio of $I_{\{200\}}/I_{\{111\}}$ of 1.5 or less is not obtained even when rolled to extremely thin foil at a high percent reduction. Through their research, the present inventor found that adopting an alloy composition that includes appropriate amounts of metals such as Fe, Ni, Co and the like to form compounds with P is effective in bringing the aforementioned integrated intensity ratio to 1.5 or less. With a copper alloy that contains appropriate amounts of these metal elements and P, metal element-P-based precipitates are formed in a stage prior to the finish cold rolling. When such a copper alloy is made into foil at a high cold-rolling percent reduction, the front and back rolled surfaces of the foil become closer to each other the thinner the foil becomes, so the precipitates themselves are subjected to strong restriction forces between the rolling rolls, and also, as the rolling percent reduction becomes greater, the increase in dislocations introduced into the Cu matrix causes dislocations to accumulate around the precipitates, and cases in which a portion thereof becomes disrupted occur. At this time, a phenomenon wherein some of the metal elements constituting the precipitates are forcibly put into solid solution within the Cu matrix is presumed to occur. This is affirmed by the present inventors' detailed measurements of conductivity (or volume resistivity).

It is thought that when metal elements are forcibly put into solid solution around the precipitates, then a unique stress field occurs around the precipitates in the interior of the foil, giving rise to the effect of promoting a reduced accumulation degree of (100) planes and an increased accumulation degree of (111) planes through the interaction with roll-working. For this reason, the drop in the integrated intensity ratio $I_{\{200\}}/I_{\{111\}}$ due to cold rolling is presumed to occur more readily in copper alloys where Fe—P-based precipitates and Ni—P-based precipitates are formed.

It is noted, however, that the mechanism whereby the flex durability is markedly improved in copper-alloy foils wherein the integrated intensity ratio $I_{\{200\}}/I_{\{111\}}$ is 1.5 or less has not been thoroughly elucidated at present.

Examples of alloy compositions, in percent by weight, that are effective in making the integrated intensity ratio $I_{\{200\}}/I_{\{111\}}$ is 1.5 or less include one where Fe: 0.045-0.095%, P: 0.010-0.030%, the sum of all elements other than Fe, P and Cu is less than 1% and the balance is Cu (a Cu—Fe—P-based alloy). In this case, the Fe/P mass ratio is even more preferably 3-3.8. Another composition is where Ni: 0.5-3.0%, Sn: 0.5-2.0%, P: 0.03-0.10%, the sum of all elements other than Ni, Sn, P and Cu is less than 1% and the balance is Cu (a Cu—Ni—Sn—P-based alloy).

When an alloy with such a range of composition is heavily worked to manufacture copper-alloy foil with a thickness of 16 μm or less, for example, not only is the flex durability markedly improved, but also this copper-alloy foil exhibits high strength and good resistance to softening.

With regard to flex durability, a superior alloy with an aforementioned MIT folding endurance of 800 cycles or greater in both the LD and TD is obtained. With the aforementioned Fe—P-based Cu alloy in particular, the present invention can provide an alloy with a MIT folding endurance of 1500 cycles or greater or even 1900 cycles or greater in both the LD and TD.

With regard to strength, tensile strengths of 540 N/mm$^2$ or greater may be obtained with foil roughly 17 μm thick, for example, or 500 N/mm$^2$ or greater may be obtained with foil roughly 12 μm thick.

With regard to resistance to softening, even after heating for one hour at 300° C. in a nitrogen atmosphere, for example, tensile strengths of 300 N/mm$^2$ or greater in both the longitudinal direction (LD) and the transverse direction (TD) with respect to the direction of rolling can be kept. Foil that has such strength properties is quite suitable to the cast method (as described before) suited to volume production of flexible circuits.

In addition, it also has a conductivity of 85% IACS or greater.

In order to make copper alloy according to the present invention, a melt of a copper alloy adjusted to the desired chemical composition is produced by the ordinary method and an ingot is cast. If necessary, that ingot may be subjected to hot rolling and the "cold rolling→annealing" process may be performed one or more times to reduce the sheet thickness, followed by heavy working performed by finish cold rolling to reach the target thickness. The thickness of the material prior to the finish cold rolling is preferably made 250 μm or less. This is more preferably 220 μm or less, or even more preferably 200 μm or less. In the case of application to flexible printed circuits, it is preferable that the material thickness of the foil be made 16 μm or less. However, if it is made too thin, this increases the burden on the process and may lead to a decrease in conductivity, so it is preferable for the material thickness to be kept at roughly 6 μm or greater.

The percent reduction in the finish cold rolling is preferably kept at 85% or greater. It is even more preferable for heavy working to be performed with a percent reduction of 90% or greater. In particular, if foil with a thickness of 16 μm or less is manufactured with the percent reduction during the final cold rolling kept at 90% or greater, then that foil will have extremely superior flex durability.

The copper alloy thus obtained is sufficiently usable as the conducting members of flexible printed circuits after the finish cold rolling as is, but the flex durability can be improved even further. Specifically, with an Fe—P-based Cu alloy or an Ni—Sn—P-based Cu alloy adjusted to the composition described above, after the finish rolling, if heat treatment in the temperature range of 300° C. or less or 350° C. or less is further performed, a tendency for the flex durability to increase slightly is exhibited. Taking advantage of this property, it is possible to achieve even further increases in the flex durability. Specifically, it is sufficient to use finish cold rolling with a high percent reduction to make an extremely thin foil (preferably with a thickness of 8-16 μm having an integrated intensity ratio $I_{\{200\}}/I_{\{111\}}$ of 1.5 or less and then heat it in a nitrogen atmosphere at 200-350° C. for 30-120 minutes. In the case of a Fe—P-based alloy, keeping the upper limit for the heating temperature to roughly 325° C. is more effective.

EXAMPLES

Example 1

Melts of Alloy A (a Cu—Fe—P-based alloy) and Alloy B (a Cu—Ni—Sn—P-based alloy) having the chemical compositions given below were prepared in a high-frequency vacuum melting furnace and ingots were cast.

Alloy A Fe: 0.077 wt. %, P: 0.025 wt. %, balance: Cu and unavoidable impurities.

Alloy B Ni: 0.98 wt. %, Sn: 0.89 wt. %, P: 0.05 wt. %, balance: Cu and unavoidable impurities.

The (180 mm thick) ingots thus obtained were hot-rolled to a thickness of 10.4 mm, quenched in water and their surfaces were ground down by 0.4 mm on each surface to obtain a thickness of 9.6 mm. The coil thus obtained was cold-rolled and then subjected to recrystallization annealing for 6 hours at 550° C. Further cold rolling was performed to a thickness of 200 μm, and then a final recrystallization annealing was performed to obtain test material. This test material (with a thickness of 200 μm) was subjected to finish cold rolling at various percent reductions to obtain copper alloys of various thicknesses as shown in Table 1 (Alloy A) and Table 2 (Alloy B).

For comparison, commercially available Tough-Pitch copper was used to make test material with a thickness of 200 μm (cold-rolled annealed sheet), and this sheet was also subjected to finish cold rolling at various percent reductions in the same manner as above, to obtain copper foil of various thicknesses as shown in Table 3.

The test materials of various thicknesses were subjected to x-ray diffraction on the rolled surface, and the integrated intensity was found for the main diffraction peaks. Here, the measurement was performed under the following conditions.

X-ray tube: Mo, tube voltage: 40 kV, tube current: 30 mA, sampling interval: 0.020°, scanning rate: 2.000°/minute, monochromator used, specimen holder: Al Note that the x-ray diffraction intensity measurement conditions are not limited to the conditions above, but rather they can be modified appropriately depending on the type of sample.

Tables 1-3 present the data and the results of calculating the integrated intensity ratio $I_{\{200\}}/I_{\{111\}}$. In addition, the results of calculating $I_{\{200\}}/I_{\{331\}}$ and $I_{\{200\}}/I_{\{220\}}$ are also presented as reference values.

Next, the MIT folding duration was measured for several specimens.

The test pieces were 25 mm-wide tapes prepared with the lengthwise direction in both the LD and the TD. Note that each test piece was subjected to MIT folding duration testing at room temperature (25° C.) based on ASTM D-2176 to find the MIT folding duration. The number of test runs was three runs (n=3) for test pieces of the same type, and the average value was found. The MIT folding duration is the number of cycles until failure when a single back-and-forth motion is counted as one cycle. The testing conditions are as follows: bending angle: ±135°, load: 500 g, bending radius: 0.8 mm. The results are presented in Tables 1-3.

TABLE 1

[Alloy A (Cu—Fe—P-Based Alloy)]

| Thickness (μm) | Finish rolling percent reduction (%) | Integrated intensity | | | | |
|---|---|---|---|---|---|---|
| | | $I_{\{111\}}$ | $I_{\{200\}}$ | $I_{\{220\}}$ | $I_{\{311\}}$ | $I_{\{331\}}$ |
| 200 | 0 | 5936 | 187948 | 35497 | 14978 | 8298 |
| 98 | 51.0 | 3169 | 58536 | 73527 | 47522 | 1807 |
| 75 | 62.5 | 2269 | 42514 | 73113 | 38779 | 2236 |
| 57 | 71.5 | 2512 | 33112 | 98426 | 32175 | 2611 |
| 33 | 83.5 | 2709 | 19567 | 105257 | 18930 | 4852 |
| 25 | 87.5 | 2717 | 13850 | 111874 | 13891 | 6728 |
| 20 | 90.0 | 3189 | 11190 | 117360 | 11918 | 7018 |
| 16.5 | 91.8 | 2890 | 7581 | 129062 | 8929 | 8237 |
| 12 | 94.0 | 5462 | 5055 | 112833 | 9279 | 10945 |
| 8 | 96.0 | 10669 | 4572 | 99795 | 8708 | 11577 |

TABLE 1-continued

[Alloy A (Cu—Fe—P-Based Alloy)]

| Thickness (μm) | Integrated intensity ratio | | | MIT folding duration | | |
|---|---|---|---|---|---|---|
| | $I_{\{200\}}/I_{\{111\}}$ | $I_{\{200\}}/I_{\{331\}}$ | $I_{\{200\}}/I_{\{220\}}$ | LD (cycles) | TD (cycles) | Category |
| 200 | 31.662 | 0.715 | 5.295 | — | — | |
| 98 | 18.471 | 1.754 | 0.796 | — | — | |
| 75 | 18.737 | 1.015 | 0.581 | — | — | |
| 57 | 13.182 | 0.962 | 0.336 | — | — | |
| 33 | 7.223 | 0.558 | 0.186 | 203 | 125 | |
| 25 | 5.098 | 0.404 | 0.124 | 454 | 238 | |
| 20 | 3.509 | 0.454 | 0.095 | 739 | 392 | |
| 16.5 | 2.623 | 0.351 | 0.059 | 1319 | 485 | |
| 12 | 0.925 | 0.499 | 0.045 | 2218 | 1904 | Invention |
| 8 | 0.429 | 0.992 | 0.046 | — | — | Invention |

TABLE 2

[Alloy B (Cu—Ni—Sn—P-Based Alloy)]

| Thickness (μm) | Finish rolling percent reduction (%) | Integrated intensity | | | | |
|---|---|---|---|---|---|---|
| | | $I_{\{111\}}$ | $I_{\{200\}}$ | $I_{\{220\}}$ | $I_{\{311\}}$ | $I_{\{331\}}$ |
| 200 | 0 | 21912 | 48243 | 89177 | 25403 | 7560 |
| 105 | 47.5 | 1983 | 19077 | 128762 | 32732 | 3066 |
| 76 | 62.0 | 1610 | 14619 | 155806 | 21845 | 4568 |
| 56 | 72.0 | 1307 | 9421 | 165640 | 15574 | 6402 |
| 38 | 81.0 | 4336 | 7119 | 152178 | 10659 | 8979 |
| 25 | 87.5 | 7826 | 4762 | 153529 | 7420 | 12350 |
| 20 | 90.0 | 9144 | 3587 | 166645 | 6164 | 12967 |
| 16 | 92.0 | 12005 | 3796 | 151665 | 6903 | 14404 |

| Thickness (μm) | Integrated intensity ratio | | | MIT folding duration | | |
|---|---|---|---|---|---|---|
| | $I_{\{200\}}/I_{\{111\}}$ | $I_{\{200\}}/I_{\{331\}}$ | $I_{\{200\}}/I_{\{220\}}$ | LD (cycles) | TD (cycles) | Category |
| 200 | 2.201 | 2.900 | 0.541 | — | — | |
| 105 | 9.620 | 0.647 | 0.148 | — | — | |
| 76 | 9.080 | 0.352 | 0.094 | — | — | |
| 56 | 7.208 | 0.204 | 0.057 | — | — | |
| 38 | 1.642 | 0.483 | 0.047 | 141 | 113 | |
| 25 | 0.608 | 0.634 | 0.031 | 330 | 292 | Invention |
| 20 | 0.392 | 0.705 | 0.022 | 488 | 485 | Invention |
| 16 | 0.316 | 0.833 | 0.025 | 968 | 1006 | Invention |

TABLE 3

[Tough-Pitch Copper]

| Thickness (μm) | Finish rolling percent reduction (%) | Integrated intensity | | | | |
|---|---|---|---|---|---|---|
| | | $I_{\{111\}}$ | $I_{\{200\}}$ | $I_{\{220\}}$ | $I_{\{311\}}$ | $I_{\{331\}}$ |
| 200 | 0 | 21864 | 234127 | 4661 | 27412 | 15881 |
| 80 | 60.0 | 5396 | 121076 | 91049 | 41609 | 1568 |
| 65 | 67.5 | 4761 | 91942 | 72999 | 37798 | 2249 |
| 40 | 80.0 | 3913 | 83640 | 83364 | 27347 | 2361 |
| 23 | 88.5 | 3834 | 57709 | 73500 | 23655 | 3389 |

TABLE 3-continued

[Tough-Pitch Copper]

| 12 | 94.0 | 4790 | 52911 | 75378 | 18747 | 5564 |
| 8 | 96.0 | 8724 | 33800 | 63973 | 14913 | 7803 |

| Thick- | Integrated intensity ratio | | | MIT folding duration | | |
| --- | --- | --- | --- | --- | --- | --- |
| ness (μm) | $I_{\{200\}}/I_{\{111\}}$ | $I_{\{200\}}/I_{\{331\}}$ | $I_{\{200\}}/I_{\{220\}}$ | LD (cycles) | TD (cycles) | Category |
| 200 | 10.708 | 1.377 | 50.231 | — | — | Comparative material |
| 80 | 22.438 | 3.441 | 1.330 | — | — | |
| 65 | 19.311 | 2.117 | 1.259 | — | — | |
| 40 | 21.375 | 1.657 | 1.003 | — | — | |
| 23 | 15.052 | 1.131 | 0.785 | — | — | |
| 12 | 11.046 | 0.861 | 0.702 | 1289 | 288 | |
| 8 | 3.874 | 1.118 | 0.528 | — | — | |

As is evident from Tables 1 and 2, in the region in which the percent reduction in the final cold rolling is high and the integrated intensity ratio $I_{\{200\}}/I_{\{111\}}$ is 1.5 or less, the MIT folding duration in both the LD and TD was greatly increased and the anisotropy between LD and TD was small. With Alloy A (Cu—Fe—P-based alloy) illustrated in Table 1, the one with a thickness of 12 μm had an MIT folding duration in excess of 1800 cycles in both the LD and TD.

On the other hand, as evident from Table 3, with Tough-Pitch copper, the integrated intensity ratio $I_{\{200\}}/I_{\{111\}}$ did not drop to below 1.5 even when rolled down to a thickness of 12 μm, and as a result the anisotropy in the flex durability was not improved.

With the $I_{\{200\}}/I_{\{331\}}$ and $I_{\{200\}}/I_{\{220\}}$ presented as reference values, the values are not stable in regions of high percent reduction (Table 1, Table 2), so they cannot be used as indices of flex durability.

When the texture was observed by a transmission electron microscope and optical microscope, the Example alloys according to the Invention Alloys of Table 1 (Cu—Fe—P-based alloys) were found to exhibit a deformation texture dispersed with Fe—P-based precipitates. In addition, the Invention Alloys of Table 2 (Cu—Ni—Sn—P-based alloys) exhibited a deformation texture dispersed with Ni—P-based precipitates.

Example 2

Cold-rolled annealed 200 μm-thick sheets of Alloy A, Alloy B and the Tough-Pitch copper prepared in Example 1 were used and then finish cold rolling was performed to obtain a foil of Alloy A with a thickness of 12 μm, a foil of Alloy B with a thickness of 16.5 μm, and a foil of Tough-Pitch copper with a thickness of 16.3 μm. These foils were subjected to one hour of heat treatment in a nitrogen atmosphere at various temperatures in the range 100-350° C. The MIT folding endurance in the LD and TD was found for the heat-treated samples in the same manner as in Example 1. FIG. 1 presents the results for Alloy B and the Tough-Pitch copper. In FIG. 1, the data points plotted at 25° C. are for the samples as finish cold-rolled.

As one can see from FIG. 1, the copper foil of Tough-Pitch copper exhibits a large amount of anisotropy in flex durability (MIT folding endurance) in the state as finish cold-rolled. But if heated, the flex durability drops greatly at 100° C.

On the other hand, the foil of Alloy B exhibits an MIT folding endurance of 800 or more cycles in both the LD and the TD in the state as finish cold-rolled, and its anisotropy is extremely small. In addition, if it is heated in the range up to 350° C., the initial superior flex durability is maintained and moreover an increasing trend is even seen between 200-350° C. To wit, the heat resistance of this alloy foil with respect to flex durability is extremely good, since the flex durability can be further increased by heating to 200-350° C.

The MIT folding endurance of Alloy A exhibited values of 2218 cycles in the LD and 1904 cycles in the TD in the state as finish cold-rolled, and after heating to 300° C., these exhibited values of 2652 cycles in the LD and 2690 cycles in the TD. Thus, Alloy A was also confirmed to have superior heat resistance with respect to flex durability.

Example 3

The softening properties were examined using the same test materials as in Example 2. However, a 17 μm-thick foil of Alloy A was also added to the test. The materials were subjected to one hour of heat treatment in a nitrogen atmosphere at various temperatures in the range 100-350° C., LD and TD tensile strength test pieces were obtained from the heated samples and tensile strength tests were conducted. The test pieces were made in the shape of JIS #5 tensile test pieces. The results are shown in FIG. 2.

As is evident from FIG. 2, Tough-Pitch copper suffered a considerable amount of softening starting from 100° C.

In contrast, although Alloy A (a Cu—Fe—P-based alloy) suffered some softening starting from 200° C., after heating to 300° C. it had more than 2.5 times the strength of the Tough-Pitch copper and even after heating to 350° C. it had more than 1.5 times the strength.

Alloy B (a Cu—Ni—Sn—P-based alloy) exhibited resistance to softening that exceeded even that of Alloy A.

What is claimed is:

1. A copper alloy foil having a thickness of 16 μm or less, wherein an integrated intensity ratio $I_{\{200\}}/I_{\{111\}}$ found by x-ray diffraction of a rolled surface is 1.5 or less, the copper alloy foil has a chemical composition, in percent by weight, of Fe: 0.045-0.095%, P: 0.010-0.030%, wherein Fe/P mass ratio is 3 to 3.8, the sum of all elements other than Fe, P and Cu is less than 1% and the balance is Cu, and the copper alloy foil exhibits a deformation texture wherein Fe—P based precipitates are present in a Cu matrix.

2. The copper alloy foil according to claim 1, wherein, when test pieces are obtained in the longitudinal direction (LD) and transverse direction (TD) with respect to the direction of rolling and a MIT folding endurance test based on ASTM D-2176 is performed under the conditions of: bending angle: ±135°, load: 500 g, bending radius: 0.8 mm, the MIT folding endurance is 800 or more cycles in both the LD and TD.

3. The copper alloy foil according to claim 1, wherein, when test pieces are obtained in the longitudinal direction (LD) and transverse direction (TD) with respect to the direction of rolling and a MIT folding endurance test based on ASTM D-2176 is performed under the conditions of: bending angle: ±135°, load: 500 g, bending radius: 0.8 mm, the MIT folding endurance is 1500 or more cycles in both the LD and TD.

4. The copper alloy foil according to claim 1, wherein after being subjected to a heating test for one hour at 300° C. in a nitrogen atmosphere, the copper alloy has a tensile strength of 300 N/mm² or greater in both the longitudinal direction (LD) and the transverse direction (TD) with respect to the direction of rolling.

5. The copper alloy foil according to claim 1, wherein the copper alloy has a conductivity of 85% IACS or greater.

6. A copper alloy foil having a thickness of 25 μm or less, wherein an integrated intensity ratio $I_{\{200\}}/I_{\{111\}}$ found by x-ray diffraction of a rolled surface is 1.5 or less, the copper alloy foil has a chemical composition, in percent by weight, of Ni: 0.5-3.0%, Sn: 0.5-2.0%, P: 0.03-0.10%, the sum of all elements other than Ni, Sn, P and Cu is less than 1% and the balance is Cu, and the copper alloy foil exhibits a deformation texture wherein Ni-P based precipitates are present in a Cu matrix.

7. The copper alloy foil according to claim 6, wherein, when test pieces are obtained in the longitudinal direction (LD) and transverse direction (TD) with respect to the direction of rolling and a MIT folding endurance test based on ASTM D-2176 is performed under the conditions of: bending angle: ±135°, load: 500 g, bending radius: 0.8 mm, the MIT folding endurance is 800 or more cycles in both the LD and TD.

8. The copper alloy foil according to claim 6, wherein, when test pieces are obtained in the longitudinal direction (LD) and transverse direction (TD) with respect to the direction of rolling and a MIT folding endurance test based on ASTM D-2176 is performed under the conditions of: bending angle: ±135°, load: 500 g, bending radius: 0.8 mm, the MIT folding endurance is 1500 or more cycles in both the LD and TD.

9. The copper alloy foil according to claim 6, wherein after being subjected to a heating test for one hour at 300° C. in a nitrogen atmosphere, the copper alloy has a tensile strength of 300 N/mm$^2$ or greater in both the longitudinal direction (LD) and the transverse direction (TD) with respect to the direction of rolling.

10. The copper alloy foil according to claim 6, wherein the copper alloy has a conductivity of 85% IACS or greater.

\* \* \* \* \*